US010990897B2

(12) United States Patent
Zarosim et al.

(10) Patent No.: US 10,990,897 B2
(45) Date of Patent: Apr. 27, 2021

(54) SELF-SERVICE CLASSIFICATION SYSTEM

(71) Applicant: REFINITIV US ORGANIZATION LLC, New York, NY (US)

(72) Inventors: Hila Zarosim, Bat Yam (IL); Oren Hazai, Tel Aviv (IL); Ofri Rom, Ganey Tikva (IL); Ehud Azikri, Herzliya (IL); Lior Weintraub, Petach Tikva (IL); Yael Lindman, Shoham (IL); Enav Weinreb, Petach Tikva (IL); Savva Khalaman, Givat Shmuel (IL); Yossi Ben-Shlomo, Tel Aviv (IL); Dmitry Levinson, Tel Aviv (IL); Evyatar Sharabi, Kfar Hess (IL); Alexandra Rabinovich Goldshlager, Tel Aviv (IL); Shai Hertz, Cambridge, MA (US)

(73) Assignee: REFINITIV US ORGANIZATION LLC (*) Notice: Subject to any disclaimer, the term of this patent is extended or adjusted under 35 U.S.C. 154(b) by 976 days.

(21) Appl. No.: 15/478,772

(22) Filed: Apr. 4, 2017

(65) Prior Publication Data
US 2017/0286869 A1 Oct. 5, 2017

Related U.S. Application Data

(60) Provisional application No. 62/318,412, filed on Apr. 5, 2016, provisional application No. 62/376,039, filed on Aug. 17, 2016.

(51) Int. Cl.
G06N 20/00 (2019.01)
G06N 5/02 (2006.01)
(Continued)

(52) U.S. Cl.
CPC ............. *G06N 20/00* (2019.01); *G06F 16/35* (2019.01); *G06F 30/20* (2020.01); *G06F 40/30* (2020.01); *G06N 5/025* (2013.01); *G06N 20/10* (2019.01)

(58) Field of Classification Search
CPC ......... G06F 16/35; G06N 20/00; G06N 5/025
(Continued)

(56) References Cited

U.S. PATENT DOCUMENTS 8,799,268 B2 8/2014 Branca
9,117,447 B2* 8/2015 Gruber .................... G06F 3/167
(Continued)

FOREIGN PATENT DOCUMENTS

WO 2017/176749 A1 10/2017

OTHER PUBLICATIONS

Erkan et al ("Improved Nearest Neighbor Methods For Text Classification") (Year: 2011).*
(Continued)

*Primary Examiner* — Lut Wong
(74) *Attorney, Agent, or Firm* — Katy Chan-Parsons; Bartholomew J. Divita

(57) ABSTRACT

Systems, technologies and techniques for generating a customized classification model are disclosed. The system and technologies, such as THOMSON REUTERS SELF-SERVICE CLASSIFICATION™, employ part machine learning and part an user interactive approach to generate a customized classification model. The system combines a novel approach for text classification using a smaller initial set of data to initiate training, with a unique workflow and user interaction for customization.

24 Claims, 11 Drawing Sheets

(51) Int. Cl.
  *G06F 16/35* (2019.01)
  *G06F 30/20* (2020.01)
  *G06F 40/30* (2020.01)
  *G06N 20/10* (2019.01)

(58) Field of Classification Search
  USPC .......................................................... 706/11
  See application file for complete search history.

(56) References Cited

U.S. PATENT DOCUMENTS

| | | | |
|---|---|---|---|
| 9,135,252 B2* | 9/2015 | Scholtes | G06F 16/30 |
| 9,298,981 B1* | 3/2016 | Ragnet | G06K 9/00442 |
| 10,891,421 B2 | 1/2021 | Weinreb et al. | |
| 2003/0051197 A1 | 3/2003 | Evans | |
| 2007/0282663 A1* | 12/2007 | Barlament | G06Q 10/10 |
| | | | 705/300 |
| 2008/0240490 A1 | 10/2008 | Finkelstein et al. | |
| 2011/0119059 A1* | 5/2011 | Ljolje | G10L 15/065 |
| | | | 704/244 |
| 2013/0318054 A1 | 11/2013 | Scholtes et al. | |
| 2014/0324808 A1 | 10/2014 | Sandhu et al. | |
| 2016/0070801 A1 | 3/2016 | Patil | |
| 2016/0078022 A1 | 3/2016 | Lisuk et al. | |
| 2016/0357731 A1 | 12/2016 | Zorzin | |
| 2017/0185583 A1 | 6/2017 | Pino et al. | |
| 2019/0188247 A1 | 6/2019 | Weinreb et al. | |

OTHER PUBLICATIONS

Chen et al ("Semi-supervised Multi-label Learning by Solving a Sylvester Equation") (Year: 2008).*
Non Final Office Action Received for U.S. Appl. No. 15/844,834, dated Jan. 27, 2020, 7 pages.
Notice of acceptance received for Australian Patent Application No. 2017246552, dated Aug. 7, 2019, 3 pages.
Thomson Reuters, "Thomson Reuters Intelligent Tagging—Powered by Calais", 2015, 2 pages. retreived from https:/financial.thomsonreuters.com/agit.
Thomson Reuters, "Making Data Intelligent", 2015, 1 page.
Response to Non Final Office Action filed on Apr. 27, 2020 for U.S. Appl. No. 15/844,834, dated Jan. 27, 2020, 9 pages.
Thorsten Joachims, "Text Categorization with Support Vector Machines: Learning with Many Relevant Features", University of Dortmund Computer Science Department, LS-8 Report 23, Dortmund, 27. Nov. 1997, Revised: 19. Apr. 1998.
Bianca Zadrozny and Charles Elkan, "Transforming Classifier Scores into Accurate Multiclass Probability Estimates", Department of Computer Science and Engineering, University of California, San Diego, Proceedings of the Eighth ACM SIGKDD international Conference on Knowledge Discovery and Data Mining, KDD '02.
Burr Settles, "Active Learning Literature Survey", Computer Sciences Technical Report 1648, University of Wisconsin-Madison, Updated on: Jan. 26, 2010.
Simon Tong, "Active Learning: Theory and Applications", Dissertation, Department of Computer Science and the Committee on Graduate Studies of Stanford University, Aug. 2001.

Fredrik Olsson, "A Literature Survey of Active Machine Learning in the Context of Natural Language Processing", SICS Technical Report T2009:06, ISSN: 1100-3154, Swedish Institute of Computer Science, Apr. 17, 2009.
Andrei Z. Broder, "Identifying and Filtering Near-Duplicate Documents", Combinatorial Pattern Matching: 11th Annual Symposium, CPM 2000, Montreal, Canada, Jun. 21-23, 2003, pp. 1-10.
Janez Brank, Marco Grobelnik, Natasa Milic-Frayling and Dunja Mladenic, "Interaction of Feature Selection Methods of Linear Classification Models", Workshop on Text Learning ICML, 2002.
Claire E. Monteleoni, "Learning with Online Constraints: Shifting Concepts and Active Learning", Computer Science and Artificial Intelligence Laboratory Technical Report, MIT-CSAIL-TR-2006-057, Sep. 1, 2006.
Rong-En Fan, Kai-Wei Chang, Cho-Jui Hsieh, Xiang-Rui Wang. Chih-Jen Lin, "Liblinear: A Library for Large Linear Classification", Journal of Machine Learning Research 9 (2008) 1871-1874, Published Aug. 2008.
Fabrizio Sebastiani, "Machine Learning in Automated Text Categorization", Istituto di Elaborazione dell'Informazione, ACM computing surveys (CSUR), 34(1):1-47, Oct. 26, 2001.
International Search Report and Written Opinion issued in related PCT Patent Application No. PCT/US2017/025937, dated Jun. 21, 2017, 9 pages.
Written Opinion Received for SG Patent Application No. 11201805746Y, dated Feb. 13, 2020, 7 pages.
First Examination Report Received for Australia Patent Application No. 2017246552, dated Mar. 14, 2019, 3 pages.
Response to Examination Report Filed on May 7, 2019 for Australian Patent Application No. 2017246552, 84 pages.
International Preliminary report on Patentability and Written Opinion received for PCT Application No. PCT/US2017/025937, dated Oct. 18, 2010, 8 pages.
Second Examination Report Received for Australian Patent Application No. 2017246552, dated May 29, 2019, 4 pages.
Response to Second Examination Report filed on Jul. 24, 2019 for Australian Patent Application No. 2017246552, dated May 29, 2019, 86 pages.
Third Examination Report Received for AU Patent Application No. 2019236757, dated Sep. 2, 2020, 5 pages.
Notice of Allowance Received for U.S. Appl. No. 15/844,834, dated Aug. 5, 2020, 8 pages.
Office Action Received for AU Patent Application No. 2019236757, dated Jul. 7, 2020, 4 pages.
Office Action Response Filed on Aug. 6, 2020 for Australian Patent Application No. 2019236757, dated Jul. 7, 2020, 86 pages.
Li, G. "A Survey on Postive and Unlabelled Learning", 2013.
Li, X., "Positive Unlabelled Learning for Document Classification", Encyclopedia of Data Warehousing and Mining, Second Edition, pp. 1552-1557, 2009.
First Examination Report Received for AU Patent Application No. 2019236757, dated May 22, 2020, 6 pages.
Response to Examination Report Filed on Jun. 12, 2020 for AU Patent Application No. 2019236757, dated May 22, 2020, 85 pages.
Notice of Allowance Received for U.S. Appl. No. 15/844,834, dated Dec. 1, 2020, 8 Pages.
Response to Third Examination Report Filed on Nov. 13, 2020 for AU Patent Application No. 2019236757, dated Sep. 2, 2020, 90 pages.
Notice of Acceptance Received for AU Patent Application No. 2019236757, dated Dec. 15, 2020, 3 pages.

* cited by examiner

| | documentId (302) | label (304) | isPositive (306) |
|---|---|---|---|
| | nr/IN630_2016_04-2/IN630_2016_04-2-23623.xml | CASE1 | TRUE |
| | nr/NEPRPCMX_2016_04/NEPRPCMX_2016_04-2544.xml | CASE1 | TRUE |
| | nr/NENSBT_2016_04-47/NENSBT_2016_04-47-20274.xml | CASE1 | FALSE |
| | nr/NENSBT_2016_04-23/NENSBT_2016_04-23-23778.xml | CASE1 | FALSE |
| | nr/NE613_2016_04/NE613_2016_04-18468.xml | CASE1 | TRUE |
| | nr/NEPRALBA_2016_04-23/NEPRALBA_2016_04-23-8756.xml | CASE1 | TRUE |
| 310a | nr/NEPRALBA_2016_04-13/NEPRALBA_2016_04-13-21291.xml | CASE1 | TRUE |
| ... | nr/IN1000_2016_04-5/IN1000_2016_04-5-6525.xml | CASE1 | TRUE |
| 310n | nr/IN244_2016_04/IN244_2016_04-269.xml | CASE1 | TRUE |
| | nr/NENSBT_2016_04-16/NENSBT_2016_04-16-21819.xml | CASE1 | FALSE |
| | nr/NE613_2016_04/NE613_2016_04-18528.xml | CASE1 | TRUE |
| | nr/NE613_2016_04/NE613_2016_04-23573.xml | CASE1 | TRUE |
| | nr/NENSBT_2016_04-4/NENSBT_2016_04-4-7866.xml | CASE1 | FALSE |
| | nr/NEPRPNLT_2016_04/NEPRPNLT_2016_04-4602.xml | CASE1 | TRUE |
| | nr/NEPRNWSL1_2016_04/NEPRNWSL1_2016_04-25054.xml | CASE1 | TRUE |
| | nr/NEPRALBA_2016_04-11/NEPRALBA_2016_04-11-17.xml | CASE1 | TRUE |
| | nr/IN305_2016_04/IN305_2016_04-6216.xml | CASE1 | TRUE |
| | nr/IN1999_2016_04/IN1999_2016_04-20422.xml | CASE1 | TRUE |
| | nr/NEPRZONE_2016_04/NEPRZONE_2016_04-3812.xml | CASE1 | TRUE |
| | nr/IN1481_2016_04-0/IN1481_2016_04-0-12861.xml | CASE1 | TRUE |

FIG. 3

```xml
<?xml version="1.0" encoding="UTF-8"?>
<document>
    <Title><![CDATA[Uber settles lawsuit with Massachusetts, California drivers for $100M]]></Title>
    <Date><![CDATA[20160422104512]]></Date>
    <Source><![CDATA[Boston Business Journal]]></Source>
    <Language><![CDATA[English]]></Language>
    <Body><![CDATA[Ride-hailing service Uber announced a settlement late yesterday in which it will pay up to $100 million to thousands of drivers in Massachusetts and California, who will in turn remain classified as independent contractors. The settlement amount represents less than two-tenths of one percent of the current estimated value of the privately held San Fransisco-based tech giant and effectively fends off a potential threat to the company's entire business model. The company made concessions to drivers, however, including allowing signs in driver's vehicles that would say tips are appreciated, and more warning and an appeals process before it can terminate drivers.
According to CNN , Uber will have to pay $84 million up front plus another $16 million if it goes public in the class-action lawsuit representing 385,000 drivers. The amount drivers will get will be be based on the number of miles they have driven for Uber, and those with more than 25,000 miles will get about $8,000 each, according to CNN.
But Uber gets to continue classifying its drivers as independent contractors rather than employees, and therefore ineligible for benefits like overtime and health insurance.
Boston labor attorney Shannon Liss-Riordan filed the case in 2014 on behalf of Uber driver Hakan Yucesory of Brookline, and sought class-action status.
But as Wired writer Marcus Wohlsen writes, the settlement doesn't actually settle very much. "By settling these suits, Uber has forestalled anything like a precedent being set by a federal judge. Even had Uber faced trial, it's not clear whether a verdict would have brought a final answer to the question of whether the company – or any one like it – had a legal obligation to classify its workers as employees. But it probably would have forced the issue," Wohlsen wrote in an article this morning .
Did you find this article useful? Why not subscribe to Boston Business Journal for more articles and leads? Visit bizjournals.com/subscribe or call 1-866-853-3661.]]></Body>
</document>
```

402 — Body content

404 — subscription footer

FIG. 4

SELF-SERVICE CLASSIFICATION SYSTEM

CROSS-REFERENCE TO RELATED APPLICATION

This application claims priority to U.S. Provisional Application No. 62/318,412, filed Apr. 5, 2016, entitled "Self-Service Classification" and U.S. Provisional Application No. 62/376,039, filed Aug. 17, 2016, entitled "Self-Service Classification". Each of the applications referred to in this paragraph is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to this document: Copyright© 2017 Thomson Reuters.

TECHNICAL FIELD

This disclosure relates to classification of documents, and more particularly methods and systems for generating a customized classification model.

BACKGROUND

Companies are accumulating voluminous amounts of data. They generate and receive countless amounts of documents, emails, reports and other content daily. The ability to classify documents to specific topics and create classification models allows for improvement in document search, an increase in productivity, a reduction in storage costs and an aid in analytics in order to better leverage the data. Professionals often face the need to identify specific information within large amounts of unstructured documents. For example, a professional interested in "gold mining", cannot afford to read every news document that mentions the word "gold". Many organizations and users resort to manually classifying their documents due to a lack of appropriate tools. This manual classification process can be labor intensive, time consuming, expensive, and error prone.

An alternative to manual classification is training Machine Learning models that will perform the classification. However, creating training data for such models could be labor intensive, and building and training such models requires Machine Learning expertise.

Typically, the classification process would start with an extensive training set that explicitly identifies positive and negative documents covering a topic. For example with 50 topics, the user would need to label a set of at least 20 K documents, with each document exhaustively labeled by tagging and identifying every topic the document covers. As such an amount of labeling is daunting, users may turn instead to ad hoc rule based solutions, which are inadequate and very hard to maintain. Additionally, a typical user is not a computer science professional and may not have the means to develop a machine learning solution to expedite the process.

Accordingly, current tools for generating a classification model require extensive training sets, which are hard to curate and do not allow the user to improve the baseline quality of the model. Our systems and techniques address both of these problems.

SUMMARY

Systems, technologies and techniques for generating a customized classification model are disclosed. The system and technologies, such as THOMSON REUTERS SELF-SERVICE CLASSIFICATION™, employ part machine learning and part an user interactive approach to generate a customized classification model. The system combines a novel approach for text classification using a smaller initial set of data to initiate training, with a unique workflow and user interaction for customization.

Various aspects of the system relate to generating a customized classification model. For example, according to one aspect, a computer-implemented method includes receiving a set of documents comprising a set of positive labeled documents and a set of unlabeled documents, processing the set of documents to remove duplicate documents and noise within the documents, generating a preliminary model for each topic of a set of topics, training the preliminary model to determine an additional set of positive and negative documents based on the set of documents, wherein training comprises in part identifying negative documents from the set of document, generating a customized classification model using the trained preliminary model and the additional set of positive and negative documents, and providing the customized classification model along with at least a precision or recall value for the model.

Positive labeled documents are documents that are known to contain or discuss a desired topic. As used herein, a labeled document refers to a document that contains an identifier relating to the topic of the document. It may also be referred to as a tagged document. When a document is determined to be positive in discussing a topic or negative in discussing a topic, it may be called a positive labeled document or a negative labeled document respectively. When a determination has not been made on the document, it may be described as an unlabeled document.

In one implementation, training the preliminary model comprises applying a nearest neighbor linking algorithm.

In a further implementation, the method comprises tuning the preliminary model and the customized classification model using one of triage rules, features selections, user feedback, or combinations thereof, based on the customized classification model and providing the customized classification model along with at least the precision or recall value for the model.

In one implementation, the tuning method using triage rules comprises providing a list of phrases to a user interface, and applying a selected list of phrases to the set of documents in response to a selection of inclusion or exclusion, wherein a document containing one or more phrases from the list of phrases are indicative of the selected topic.

In another implementation the method for tuning using features selection comprises providing a features list to a user interface, the features list further comprising a list of phrases which characterize documents associated with topic, and applying a selected list of features to the set of documents in response to a selection of inclusion or exclusion. The method may also further include weighting the features list based on a ranking.

In another further implementation the method for tuning using user feedback comprises providing a selectable dialog box on a user interface to indicate confirmation of a document relating to a topic.

In yet another further implementation, the method comprises testing the customized classification model on a predetermined test set of documents and presenting to the user the precision and recall values associated with the testing. The method may also further comprise publishing the customized classification model. The publication may be to a production server such as THOMSON REUTERS ONECALAIS™.

Advantageously, the training process is characterized by minimal preparation of data, so that an initial classification model generated by the system can be obtained rapidly. The system categorizes unstructured content by applying text analytics techniques to extract the meaning buried within the content. Generally, the system does not require a large data set of positive and negative examples like traditional text classification systems but uses a small set of positive documents and an unlabelled set of documents from which it selects negative and additional positive documents, to create the training sets needed to train classification models.

Furthermore, the system also allows the user to tune and improve the model by doing a series of tasks. We have designed and implemented a workflow to enable users who are not computer scientists to develop and deploy classification models for their own data. This workflow includes model tuning capabilities that are not present in other systems. The user's interaction during the tuning phase allows for improvement and tailoring of the classification model.

Additional features and advantages will be readily apparent from the following detailed description, the accompanying drawings and the claims.

BRIEF DESCRIPTION OF THE DRAWINGS

FIG. 3 illustrates an exemplary set of documents;

FIG. 4 illustrates an exemplary document from a set of documents; and

DETAILED DESCRIPTION

In the following description, reference is made to the accompanying drawings that form a part hereof, and in which is shown by way of illustration specific implementations in which the disclosure may be practiced. It is to be understood that other implementations may be utilized and structural changes may be made without departing from the scope of the present disclosure.

Figure 1:
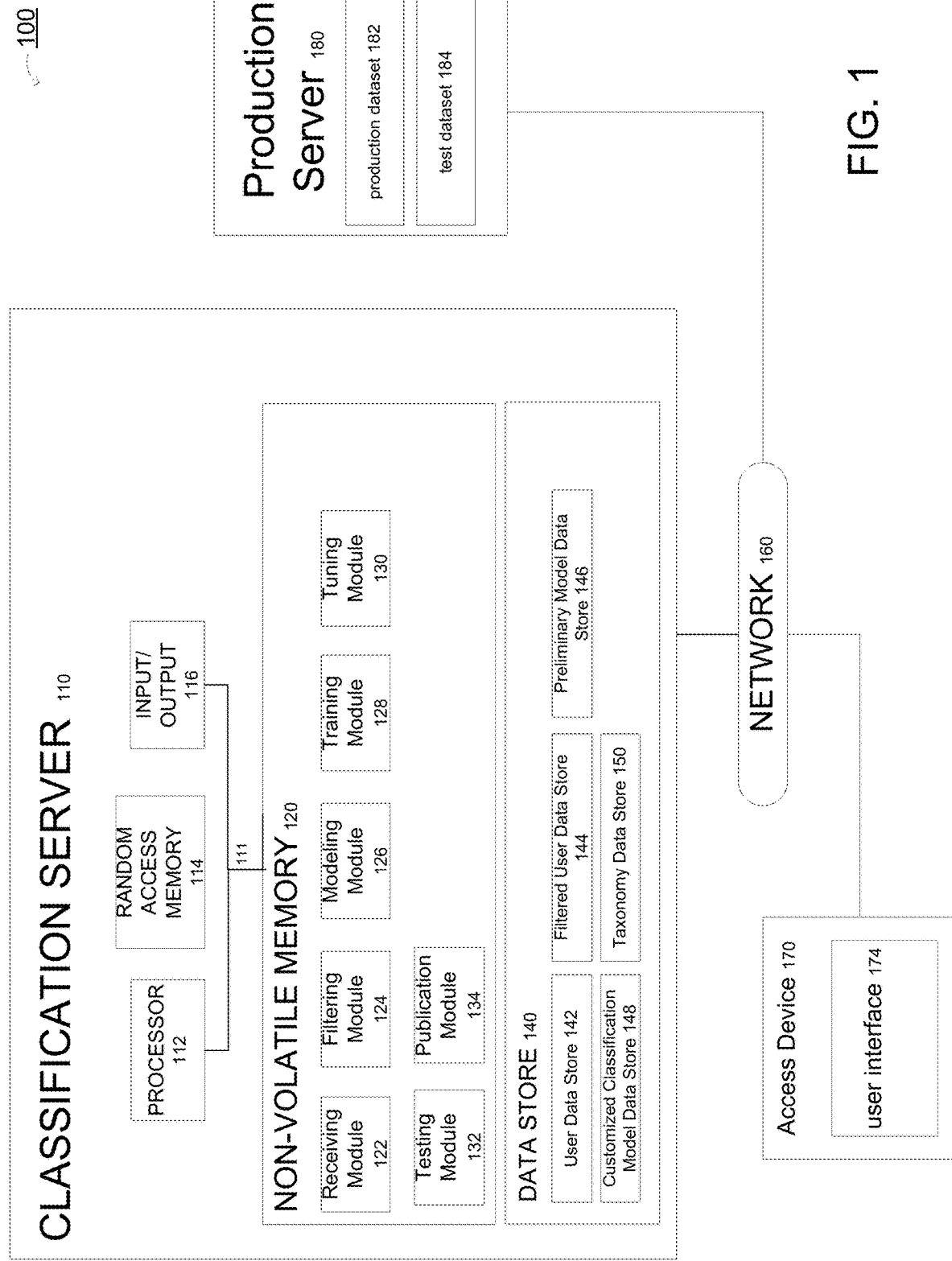
FIG. 1 is an exemplary architectural diagram of the system.

FIG. 1 shows an exemplary system 100 for providing self-service classification. As shown in FIG. 1, in one implementation, the system 100 is configured to include an access device 170 that is in communication with a classification server 110 over a network 160. Access device 170 can include a personal computer, laptop computer, or other type of electronic device, such as a mobile phone, smart phone, tablet, PDA or PDA phone. In one implementation, for example, the access device 170 is coupled to I/O devices (not shown) that include a keyboard in combination with a point device such as a mouse for sending classification request to the classification server 110. Preferably, memory (not shown) of the access device 170 is configured to include a user interface 174 that is used to request and receive information from classification server 110. In one implementation, the user interface 174 may be part of a web browser (not shown), which allows a user to access and retrieve information from the classification server 110. Communication between the user interface 174 of the access device 170 and server 110 may utilize one or more networking protocols, which may include HTTP, HTTPS, RTSP, or RTMP. Although one access device 170 is shown in FIG. 1, the system 100 can support one or multiple access devices.

The network 160 can include various devices such as routers, servers, and switching elements connected in an Intranet, Extranet or Internet configuration. In some implementations, the network 160 uses wired communications to transfer information between the access device 170 and server 110. In another implementation, the network 160 employs wireless communication protocols. In yet other implementations, the network 160 employs a combination of wired and wireless technologies.

As shown in FIG. 1, in one implementation, the classification server 110, may be a special purpose server, and preferably includes a processor 112, such as a central processing unit ('CPU'), random access memory ('RAM') 114, input-output devices 116, such as a display device (not shown), and non-volatile memory 120, all of which are interconnect via a common bus 111 and controlled by the processor 112.

In one implementation, as shown in the FIG. 1 example, the non-volatile memory 120 is configured to include a receiving module 122 for receiving data files from the user interface 174 on the user's access device 170. Files received from the user interface 174 may be but is not limited to a set of documents, a data set or a corpus of documents. In one embodiment, the files are transferred through network 160 from the user interface 174 to the server 110. In a further implementation, the data received may be stored in user data store 142.

The non-volatile memory 120 also includes a filtering module 124 for processing data received by the receiving module 122. The processed data may then be stored in filtered user data store 144. In one implementation, processing of the data may comprise but is not limited to removing duplicate documents, eliminating noise in documents or removing documents not in the proper format or size.

The non-volatile memory 120 is also configured to include a modeling module 126 for generation of classification models, examples of which may be a preliminary classification model or a customized classification model. The modeling module 126 may then store the classification models in preliminary model data store 146 and customized classification model data store 148, respectively. Modeling module 126 may also compute precision, recall and F1 values or F1 score for a model. As used herein, the terms F1 value, F1 score, or F-measure are used interchangeably and refer to a mean of the precision and recall values.

As shown in the FIG. 1 example, the non-volatile memory 120 may also be configured to include a training module 128 for analyzing documents. The training module 128 may also determine positive and negative documents (or additional positive and negative documents) from a set of documents. These determined positive and negative documents may be used for training and model generation by modeling module 126.

The non-volatile memory 120 is also further configured to include a tuning module 130 for receiving input from the user interface 174 and applying the received input to the preliminary and customized classification models.

The non-volatile memory 120 is also configured to include a testing module 132 for testing the model generated by the modeling module 125. The testing module 132 may also compute precision and recall value and F1 score relating to the testing of a dataset.

The non-volatile memory 120 is also further configured a publication module 134, for publishing the model upon approval by the user. In one implementation, the model is published when the precision and recall values meets the user's desired values.

As shown in the exemplary FIG. 1, a data store 140 is provided that is utilized by one or more of the software modules 122, 124, 126, 128, 130, 132 and 134 to access and store information relating to the creation of a model. In one implementation, the data store 140 is a relational database. In another implementation, the data store 140 is a file server. In yet other implementations, the data store 140 is a configured area in the non-volatile memory 120 of the event detection server 110. Although the data store 140 shown in FIG. 1 is part of the classification server 110, it will be appreciated by one skilled in the art that the data store 140 can be distributed across various servers and be accessible to the server 110 over the network 160.

As shown in FIG. 1, in one implementation, the data store 140 is configured to include a user data store 142, a filtered user data store 144, a preliminary model data store 146, a customized classification model data store 148 and a taxonomy data store 150.

The user data store 142 includes data provided by the user and received by the receiving module 122. In one implementation, the data may be a set of documents comprising a set of positively labeled documents and a set of unlabeled documents.

The filtered user data store 144 includes data that have been through processing by the filtering module 124. For example, a set of document with duplicates and noise removed.

The preliminary model data store 146 includes a preliminary model generated by modeling module 126 based on the filtered data set of 144, which consists of a preliminary model for each topic of a set of topics. In one implementation, the preliminary model is based in part on the set of positive documents and unlabeled set of document and may be used by modules 126, 128, 130, 132, to determine additional positive and negative documents. The preliminary model may contain a precision and recall value as computed by the modeling module 126.

The customized classification model data store 148 includes the model generated by modeling module 126 after training of a set of data by training module 128 and applying determined positive and negative documents to the preliminary model. The customized classification model may contain a precision and recall value as computed by the modeling module 126.

The taxonomy data store 150 includes a set of taxonomies for use by the system. In one implementation, the taxonomies may be generated by the filtering module 124. In another implementation, the taxonomies may be based on the determined taxonomies from a production data set 182 or a test dataset 184 in server 180.

In a further implementation, as shown in FIG. 1, a production server 180 includes a processor (not shown), random access memory (not shown) and non-volatile memory (not shown) which are interconnected via a common bus and controlled by the processor. In one implementation, the data in the production server 180 may contain a production dataset 182 and a test dataset 184 which may be communicated through network 160 and utilized by the classification server 110.

It should be noted that the system 100 shown in FIG. 1 is one implementation of the disclosure. Other system implementations of the disclosure may include additional structures that are not shown, such as secondary storage and additional computational devices. In addition, various other implementations of the disclosure include fewer structures than those shown in FIG. 1.

Figure 2:
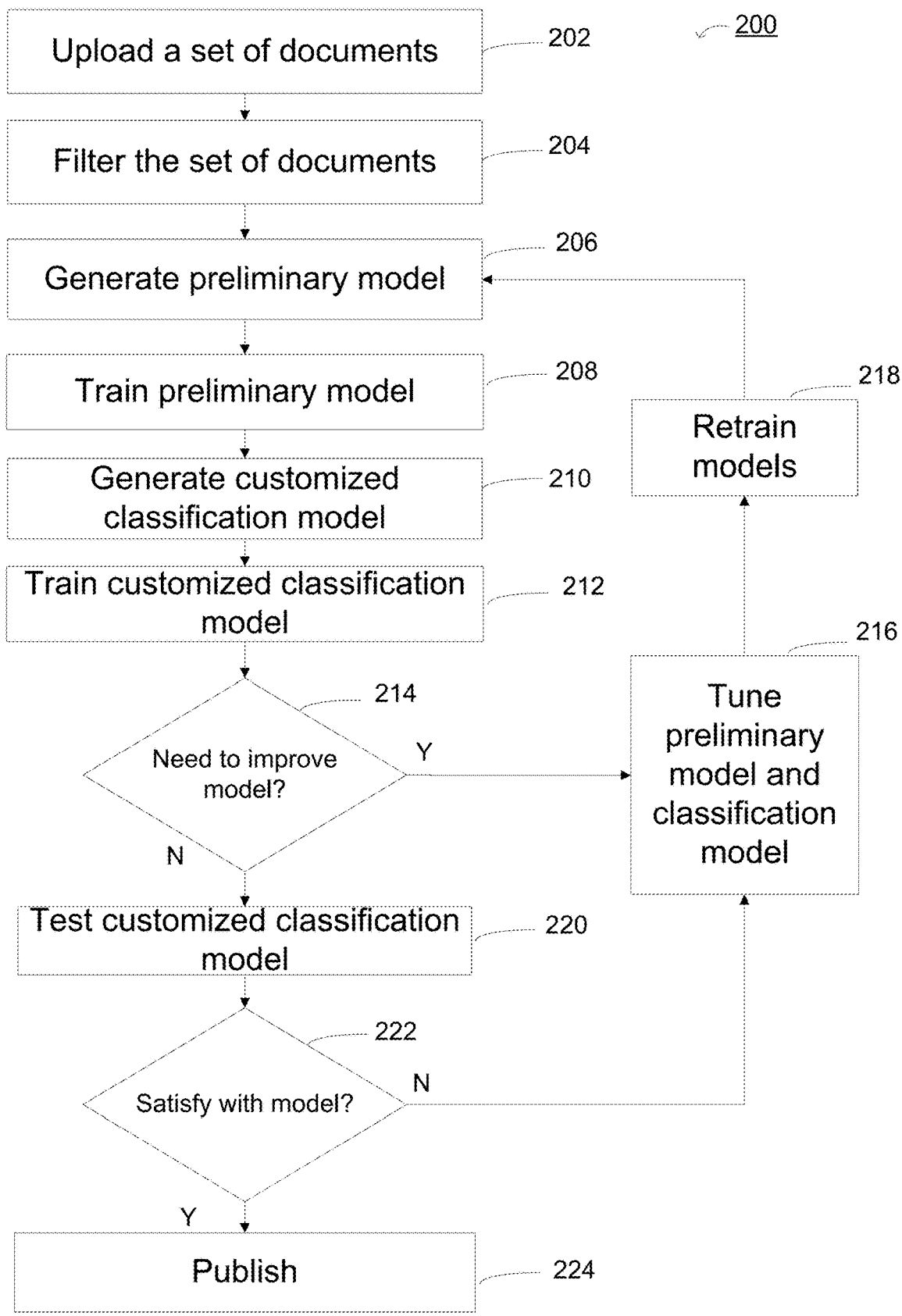
FIG. 2 is an exemplary flow chart of one implementation of the disclosure.

Referring now to FIG. 2, an exemplary method 200 of generating a customized classification model is disclosed.

As shown in the FIG. 2, at step 202, a data file is provided by the user through user interface 174 of access device 172 and is received by the receiving module 122. In one implementation, the data file may be an uploaded set of documents, comprising in part but not limited to, a set positive labeled documents (i.e., documents that discuss a topic and labeled as positive) and a set of unlabeled documents (i.e., documents not designated as positive or negative for discussing a topic). In an alternative embodiment, the user may utilize the data sets already in the system, for example those stored in production server 180.

An exemplary data file for a set of documents provided by the user through user interface 174 is illustrated in FIG. 3. An exemplary document from the set of documents is illustrated in FIG. 4 in the form of an individual XML file. While an exemplary XML file is shown, additional file formats such as PDF, text or the like may also be used by the system.

Upon receiving the set of documents, the receiving module 122 stores the data into the user data store 142. In another embodiment, the documents are indexed and stored using ElasticSearch.

Next at step 204, the filtering module 124 retrieves the set of documents from user data store 142 and processes the retrieved documents. Exemplary processing by the filtering module 124 may include identification of duplicates amongst the uploaded documents (i.e., if the received set of documents contains multiple copies of the same document) and removes them from the set of documents.

In another implementation, the filtering module 124 identifies duplicates using the algorithm as presented in Broder, "Identifying and Filtering Near-Duplicate Documents", Combinatorial Pattering Matching: 11$^{th}$ Annual Symposium, CPM 2000, Montreal, Canada, Jun. 21-23, 2000. For every group of near-duplicate documents, the system chooses one of the documents as representative of this group and all its duplicates are discarded.

In a further implementation, the filtering module 124 may also process each document of the set of documents to identify noise or irrelevant zones (i.e., areas in a document not to be relied on for classification) and removing them from the set of documents.

An exemplary noise may be but is not limited to names, email addresses, links, the name of the news source or references to other news stories, appearing in zones such as the headers or footers in a document as they may not be relevant to the classification of the document. As shown in exemplary FIG. 4, noise 404 refers to text that is irrelevant to classification. The processed documents are then stored into filtered user data store 144.

In another implementation, areas containing noise may be identified by filtering module 124 after detecting repeated patterns appearing in the uploaded documents. For each such pattern, the filtering module 124 may determine an irrelevance score which is composed of the frequency of the pattern along with the average location in the document in which it appears. The filtering module 124 may clean up the document or create a new file so that every document contains only the relevant text with irrelevant patterns or zones removed.

In yet a further implementation, the filtering module 124 may remove files that exceed a predefined maximum allowed file size or files that are not in a specific format (i.e., files that is not in XML format).

At step 206, once filtering is completed on the set of the documents, a preliminary model is generated by the modeling module 126 for each topic of the set of topics of the set of documents from filtered user data store 144. In one implementation, the modeling module 126 builds a taxonomy from the information in the set of documents, which may include but is not limited to the set of positive labeled documents and set of unlabeled documents. The taxonomy may then be stored in taxonomy data store 150.

In another implementation, the preliminary model is generated based on the filtered set of positive labeled documents and the set of unlabeled documents received from the user. The generated preliminary model is then stored in preliminary model data store 146.

Continuing onto step 208, the training module 128 retrieves the preliminary model from the preliminary model data store 146 and detects topics in the set of documents. Training a topic generates a classification model for the topic. During training, training module 128 parses the positive and unlabeled documents to figure out the characteristics of documents that discuss this topic. Based on this information, the system defines triage rules and model features which determines how the model will identify topics.

In one implementation, the training module 126 detects negative labeled documents (i.e., documents that do not mention the topic) from the set of documents using the set of positive documents and set of unlabeled documents.

Figure 6:
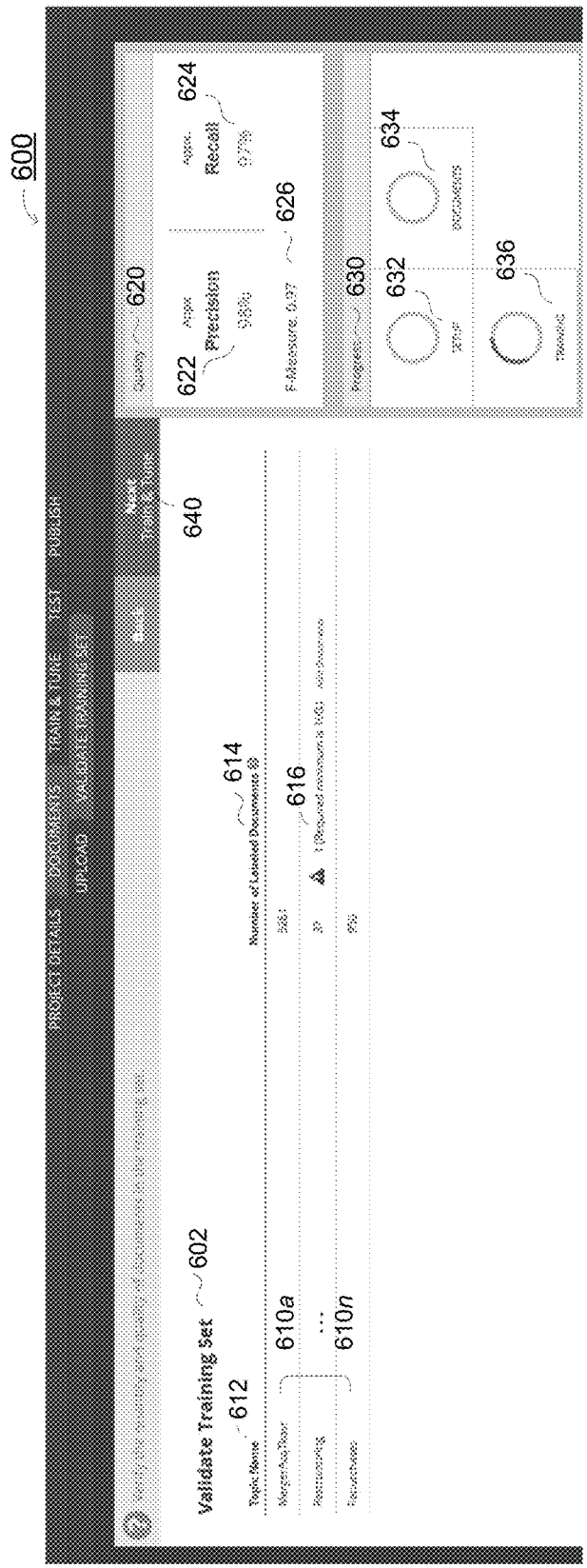

In another implementation, a count of the types of documents in the set of documents is provided through the user interface 174. If additional negative documents are required to train the topic, the user is prompted on the user interface 174 (similar to what is shown in FIG. 6) to add additional documents to the set of documents. This may be the user modifying the initial document set (i.e., the set of documents transmitted in step 202) and then transmit or upload the modified initial document set to a new project.

In a further implementation, the set of positive documents for a topic may consist of a few hundred documents, whereas the size of the unlabeled corpus might be hundreds of thousands of documents, most of which may not be relevant to the topic. A set of phrases that distinguish the potentially positive documents from clear negatives are computed. In one implementation, clues from the known positive documents helps yield clear negatives, which are then removed from the set of unlabeled documents.

In one implementation, the training module 128 may identify a set of rules (i.e., triage rules) that a positive document has to follow and use it to rule out any document in the corpus that does not follow these rules, thereby identifying clear negatives and rule them out. For example, in the case of "gold mining", a rule may be that document must contain the phrase "gold". The phrase "gold" can be an exemplary phrase in a set of phrases. However, after applying this rule, all remaining documents, some of which may be negative documents, contain the term "gold". For instance, while positive documents discuss "gold mining", the negative documents may discuss other topics such as "sport documents dealing with gold medals". Since the remaining documents are a small and focused set of documents, the classifier can better come up with common negative features. In this example, the feature "medal" may be a negative feature.

In a further implementation, in order to obtain a set of phrases to be applied by a set of rules, a greedy algorithm may be used that compares the frequencies of the phrases in the positive documents to their frequencies in the corpus and to find a minimal set of phrases that cover all areas in the positive set.

Once the rules have been applied, we are left with the originally labeled positive documents and a small subset of the unlabeled corpus that followed the rules, this set of documents may be referred to as a reduced corpus, or a set of documents resulting from the training.

The training module 128 then extracts positive and negative documents from the resulting set of documents (i.e., the reduced corpus) through selection of a predetermined number of features (i.e., words or terms) relating to a topic and generating a list of most important features per topic. An exemplary amount but not limited to, may be a dozen chosen features per topic.

In further implementation, the training module 128 may use a nearest neighbor analysis on the set of documents or on the reduced corpus. For every document, its k nearest neighbors are computed using the similarity of the terms or words determined as features. The k nearest neighbors are selected amongst the set the reduced corpus along with the set of labeled positive documents for a topic in interest. A positiveness score is determined by the concentration of documents containing similar feature words or terms (i.e., positive documents) within the k nearest neighbors. This positiveness score is computed for every document in the reduced corpus. Documents in the reduced corpus with a high positiveness score are selected as positives, and documents with a low positveness score are selected as negatives, and the documents with an intermediate positiveness score may be disregarded or discarded. It is suggested that the set of disregarded or discarded documents be as small as possible. In a further implementation, the positiveness score may contain a predetermined threshold defined by the system, wherein exceeding or not exceeding the threshold indicates the document as positive labeled document or negatives labeled document respectively.

Once training is completed by the training module 128, continuing onto step 210, the modeling module 126 applies the determined set of positive and set of negative labeled documents resulting from step 208 (i.e., training data, training set, additional set of positive and negative documents, additional set of positive and negative labeled documents or an updated set of documents resulting from training and/or tuning and/or testing) to the preliminary model to generate a customized classification model. The modeling module 126 also computes a precision and recall values for the customized classification model and each topic of the customized classification model. The customized classification model may then be stored into customized classification model data store 148.

Next at step 212, using the set of positive and negative labeled documents, training module 128 may use a standard machine learning classification algorithm to train the customized classification model for the topic. The system also generates a list of questionable documents, i.e., documents it could not identify either as negative or positive with a high degree of certainty.

In one implementation, linear SVM (Thorsten Joachims, "Text categorization with support vector machines: learning with many relevant features", Springer, 1998) is used along with isotonic regression (Bianca Zadronzny and Charles Elkan, "Transforming classifier scores into accurate multi-class probability estimates", Proceedings of the Eight ACM SIGKDD International Conference on Knowledge Discovery and Data Mining, KDD 2002, pages 694-699) to train the model, where the set of features consists of bag-of-words unigrams, bigrams and skip-grams. LibLinear may also be used for training (Fan et al., "Liblinear: A library for large linear classification" The Journal of Machine Learning Research, 9:871-1874, 2008) which is an open source library for large-scale linear classification and provides an implementation of the SVM algorithm.

Additionally, a 2-fold cross validation is applied to the set of documents which provides a confidence score for every document in the training set. In a further implementation, a multi fold, for example, 10-fold cross validation is applied to the set of documents. This confidence score measures the positiveness of every document (i.e., topic is indeed discussed in the document) with respect to the training data and is used in the tuning phase. In one implementation, the system identifies a document that contains a discrepancy between the positveness score and the confidence score. These documents are flagged as questionable documents and are assigned an uncertainty score. Documents containing a high uncertainty score are candidates for user-feedback or further improvement.

Once training has been completed on the customized classification model, continuing to step 214, one or more approximate scores are generated by the modeling module 126 and presented to the user through user interface 174 along with the customized classification model. In one implementation, the scores may be but not limited to, a precision and recall value for the model. Precision measures the accuracy of a model in identifying the topic of a given document. Recall measures the fraction of relevant documents that are retrieved for a topic. Initially, the precision and recall values are rough estimates, but the more a model is trained and tuned, the more accurate the values are in reflecting real model quality. The initial rough estimates are due to the unlabeled corpus. However, once the user uploads a fully-labeled test set, as described later in relation to step 220, the precision and recall values (i.e., P/R values) are reliable regardless of the number of tuning-iterations, if the test set represents the true production distribution. If the user through user interface 174 determines that the scores for the model is not to their liking (i.e., not satisfied with the precision and recall values), user may want to perform additional improvements to the model and proceeds to step 216 to tune the model. Tuning affects both the customized classification model and the preliminary model.

In one implementation, tuning by tuning module 130 comprises but is not limited to, applying one of triage rules, features selections, user feedback or combinations thereof, to the customized model.

Tuning by triage rules allows the user to revise the initial triage rules, by including or excluding (enable or disable) the rules or add a triage rule. When adding triage rules, entire word families (i.e., enter, enters, entered, acquisition, acquisitions, acquired, acquire,) and relevant synonyms that also characterize documents that discuss the topic (acquisition, merger, procurement, takeover) are suggested. As show in exemplary FIG. 8, in one implementation, the user is presented with an interactive screen on user interface 174 containing a list of triage rules, which may include stop words symbolized by underscores, with selectable options to disable or enable a rule. Continuing with the aforementioned example for 'gold mining', the user may want to further include the term "August" so that positive documents may relate to gold mining published in 'August'. Vice versa, if the user wants to remove the 'August' term, they may disable the rule for 'August'. Tuning triage rules directly affect recall wherein recall measures the fraction of relevant documents that are retrieved for a topic. As an example, if the classifier identifies nine out of ten documents are about a topic, the recall is 90%.

Tuning by features entails enabling or disabling a feature previously determined by the system or adding a feature. A feature may be one or more words or terms relating to a topic. Features are also characteristic phrases to be used by the classifier to identify which of the candidate documents discuss the topic. In one implementation, the features may be nearest neighbor features. As show in exemplary FIGS. 9a and 9b, the user is presented with an interactive screen on user interface 174 containing a list of features, with selectable options to disable or enable a feature or add a feature. When adding a feature, similar to adding triage rules, entire word families and relevant synonyms are also suggested. Disabling a feature higher in the list will have greater affect than disabling a feature that appears lower in the list. Tuning model features directly affect precision (i.e., the accuracy of topic tags). As an example, if 8 out of 10 documents identified as being about a certain topic are indeed about the topic, the precision is 80%.

Tuning by feedback is when the system presents to a user via user interface 174 questionable documents to allow the user to modify labeled documents. As shown in exemplary FIG. 10, in one implementation, the user is presented with an interactive screen on user interface 174 containing a list of questionable documents based on the uncertainty score as determined in step 212. The user may then select 'yes' or 'no' to confirm or deny if the document is about a topic.

After tuning, the set of positive and negative labeled documents may change. Continuing to step 218, the training module 128 applies the changes indicated by the user from step 216 and steps 206, 208, 210, 212, 214 are then repeated as described previously.

Returning to step 214, once the user is satisfied with the quality of the customized classification model, the user can test the quality of the customized classification model on an exemplary test dataset.

Continuing onto step 220, the training module 132 may apply one or more test datasets to the customized classification module and generate a test result. A test dataset is a labeled set of documents for a topic or a few topics that were prepared in advance. In one implementation, the test dataset may be the test dataset 184 from production server 180 and communicated to testing module 132. In another implementation, the user may provide a test dataset through user through user interface 174 of access device 172 and is received by the testing module 132. In a further implementation, previously determined taxonomies, like the ones stored in taxonomy data store 150 may be used in the testing process.

Figure 11A:
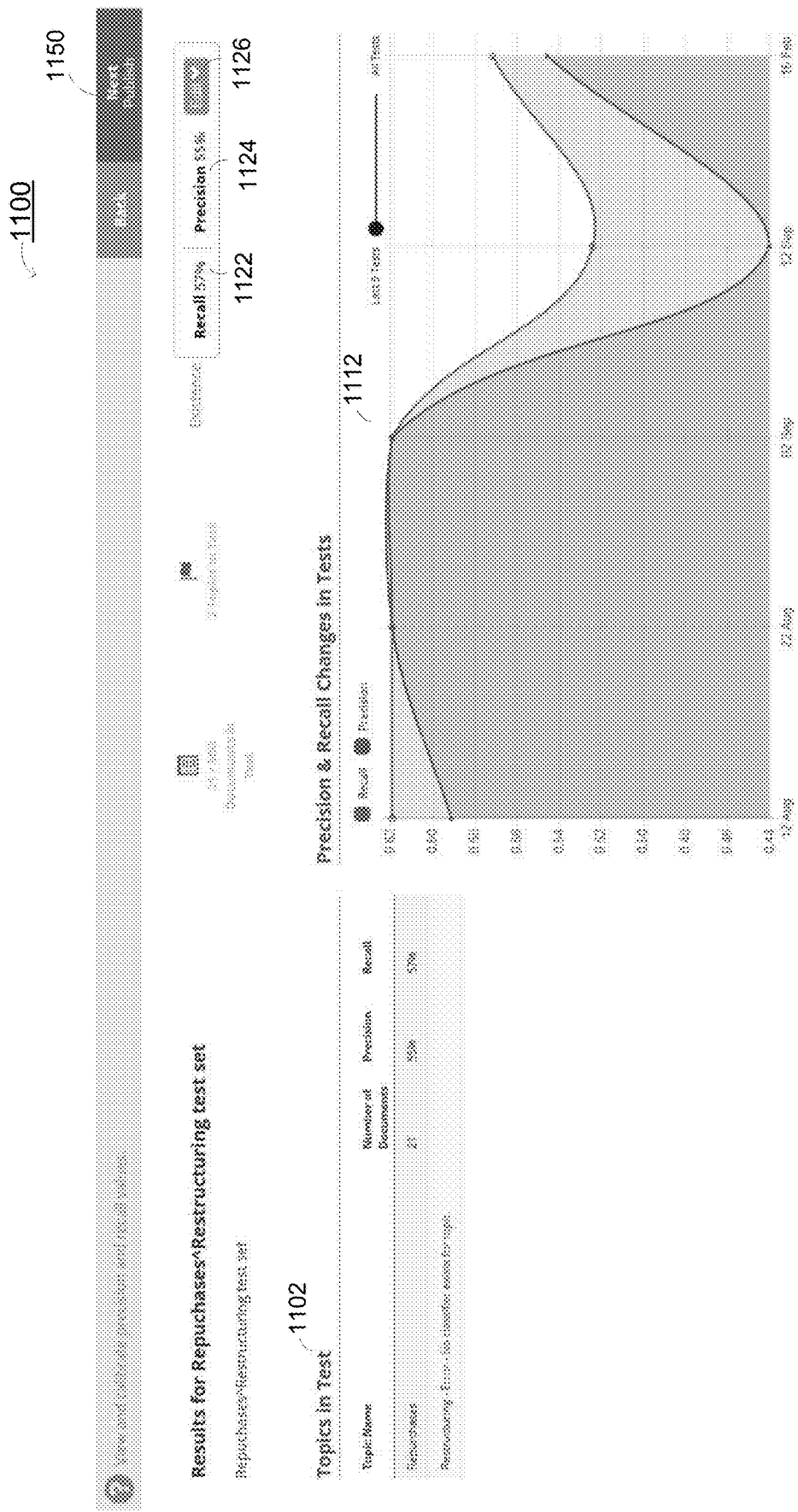

As shown in FIG. 11a, an exemplary test result is presented to the user through user interface 174. Test results may contain but are not limited to, precision and recall values calculated by testing module 132 which validates the quality of the model. A F1 score may also be calculated by testing module 132, however, it may or may not be presented to the user. If the quality is not satisfactory to the user at step 220, the user may further tune the model and steps are 216, 218, 206, 208, 210, 212, 214, 220 are then repeated until the test results indicate the desired quality.

Finally, at step 224, if the precision and recall values meet the user's requirements, the customized classification model is saved in the customized classification model data store 148 and may be published by publication module 134. In one implementation, the publication of the customized classification model is published into a production environment such as THOMSON REUTERS INTELLIGENCE TAGGING (TRIT) SERVICE™ or THOMSON REUTERS ONECALAIS™.

FIG. 3 illustrates an exemplary data file for a set of documents. In one implementation, the data file may be the user uploaded file as described in step 202 and contains column documentID 302, listing all the documents 310a-310n of the set of documents for n number of documents, each of the documents may be but is not limited to, an xml file. The file also includes a label 304 column indicating the topic and isPostive 306 column indicating if the document is positive for the topic, with 'True' indicating positive and 'False' indicating negative. If a document can be assigned more than one relevant topic, the filename is listed multiple times in the file, once per topic.

FIG. 4 illustrates an exemplary document from a set of documents comprising body of the text 402 and noise 404. While this exemplary document is a news article, documents from the set of documents may be related to other topics or forms. Noise 404 is detected and removed by the filtering module 124 (as described in step 204 of FIG. 2) so that text such as "did you find this article useful? Why not subscribe to the Boston business Journal . . . " is not relied upon for classification since it does not pertain to the actual story content.

Figure 5:
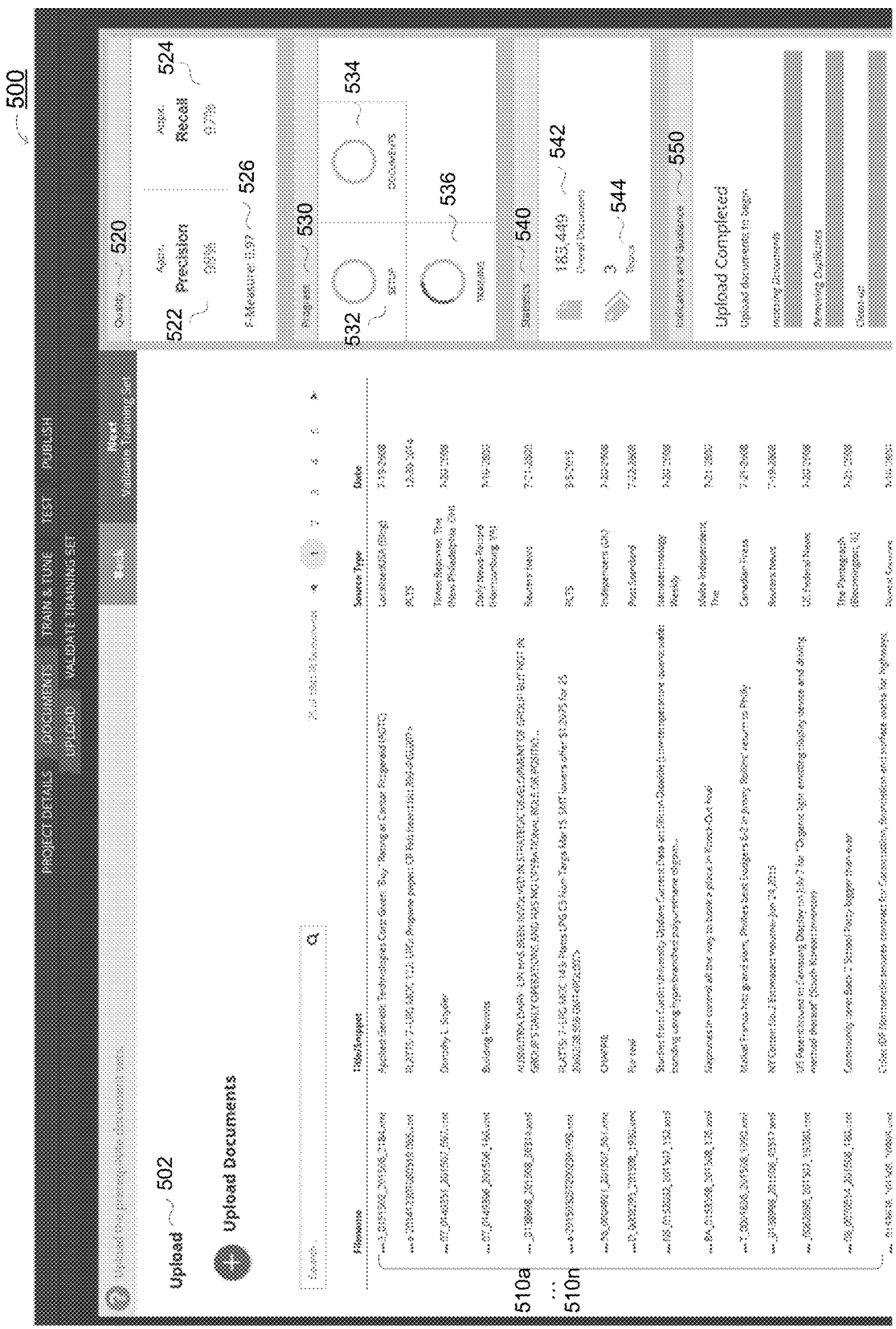
FIGS. 5-11b illustrates the exemplary graphical user interface (GUI) corresponding to exemplary steps of FIG. 2.

Now turning to FIG. 5, an exemplary graphical user interface (GUI) available through the user interface 174 of access device 170 is disclosed. In one implementation, the user interface 174 includes an application interface 500 that includes a header 502 indicating the step of the classification process. In the FIG. 5 example, header 502 is representative of the upload stage, as described in steps 202-204 of FIG. 2. The application interface 500 may include but is not limited to a listing of uploaded files 510a-510n.

In further implementation, application interface 500 may also include section 520 with information pertaining to the quality of the uploaded documents. In this example, quality may be designated by a precision value 522 and recall value 524 and a F-Measure value 526, which may be a harmonic mean of precision and recall values. The F-Measure value allows for one number to describe a model's quality, thereby easing the comparison of two different models.

In a further implementation application interface 500 may also include section 530 indicating the progress of the classification, with an exemplary value indicator for the progress of setup 532, progress of documents 534 and progress of training 536.

In another further implementation application interface 500 may also include section 540 indicating statistics relating to the uploaded documents. An exemplary statistic may be but not limited to the number of overall documents 542 and number of total topics 544.

In yet another implementation application interface 500 may also include section 550 relating to indicators and guidance, which may be an visual illustration of the status of the uploading process and the status of the processing by filtering module 124 (i.e., removing duplicates, clean up).

Continuing onto FIG. 6, an exemplary graphical user interface (GUI) available through the user interface 174 of access device 170 is disclosed. In one implementation, the user interface 174 includes an application interface 600 that includes a header 602 indicating the step of the classification process as 'validate training set'. The training set may be listed by topic name 612, with topics 610a-610n and the corresponding number of labeled documents 614. In a further implementation, if the number of labeled document does not meet a predetermined threshold requirement as determined by filtering module 124, an error message 616 may be displayed with a note to add more documents.

In a further implementation, application interface 600 may include section 620 with information pertaining to the quality of the training set. In this example, quality may be designated by a precision value 622 and recall value 624 and a F-Measure value 626.

In yet a further implementation, application interface 600 may include section 630 with information pertaining to progress of the classification, similar to 532-536 as depicted in FIG. 5, with an exemplary value indicator for the progress of setup 632, progress of documents 634 and progress of training 636. Once the training sets are validated by the user through user interface 174, the user may select 640 for "Next" to proceed with the process.

Figure 7:

The application interface depicted in FIG. 7, illustrates the next step of 'train topics' 702, as described in step 208, 212 and 218 of FIG. 2. In one implementation, application interface 700 may present columns for topic name 712 with a list 710a-710n of topics; count of corresponding positive documents 714; corresponding precision value 716 and corresponding recall value 718. The user through user interface 174, may select the option to train all topics 720 or train individual topics 722 or tune individual topics 724 based on the user's analysis of the metrics 714-718 relating to the topic. Once the training has been completed on a topic, a customized classification model, or an updated preliminary model and updated classification model, may be generated by the modeling module 126 as described in steps 206 and 210 of FIG. 2.

Figure 8:

However, should the user decide that a topic requires tuning, upon selection of tune 724, the user may be presented with application interface 800 as depicted in FIG. 8. In one implementation, user interface 800 may present the header 802 for tune with an option for tuning triage rules 804 as described in steps 214-216 of FIG. 2. In the FIG. 8 example, the triage rules are for the topic 'repurchases'. The user may have an option to view 842 all triage rules, enabled triage rules or disabled triage rules. In a further implementation, the user may be presented with columns depicting the enable/disable status 812, the name of the term 814, the count of documents found in corpus 816 (i.e., the number of corpus documents in which the term was found. Corpus referring to the entire corpus of uploaded unlabeled documents plus the labeled training set uploaded for this topic) and the count of documents found in the training set 818 (i.e., the number of positive documents in which the term was found, with the positive documents being the positive documents part of the set of documents initially transmitted by the user, the positive documents identified by the training phase and any documents manually designated as positive by the user from feedback), and rows 810a-810n for each term.

The numbers reflected in column 816 and 818 may provide insight to the corresponding term, for instance, if a term appears in a disproportionately large number of corpus documents, then the term is probably too general. In another instance, if the number of positive documents is low for an obviously important term, then a closer examination of the transmitted positive labeled set might be desired. The user may select to change the disable or enable status for each term. A precision 822 and recall value 824 may also be presented in application interface 800.

In another implementation, the user may have the option to search for a specific triage rule 830 or add a triage rule 832. Once the user is satisfied with enabling and disabling their desired terms, the user may click on recalculate 834 to retrain the models as described in step 218 of FIG. 2. The user may also proceed to tune the documents based on 'feedback' 836.

Figures 9A, 9B:
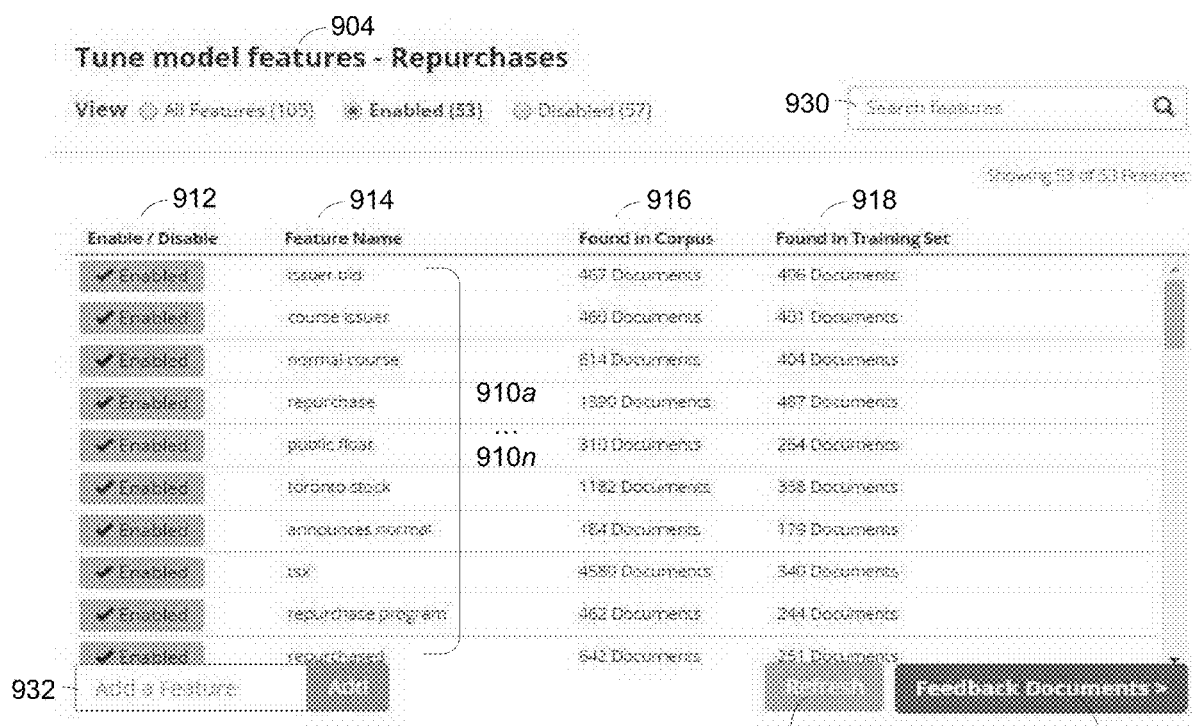

In a further implementation, the user may tune using model 'features' 904 as depicted in FIGS. 9a and 9b. Tuning by model features is by the user selecting or disabling a feature listed in rows 910a-910n. Similar to FIG. 8 for 'term', each 'feature' has a corresponding column for enable/disable 912, feature name 914, number of documents found in corpus 916 and number of documents found in training set 918. Furthermore, similar deductions as described in relation to FIG. 8, may also be made using the corresponding number in 916 and 918 for a feature. (i.e., deductions regarding generality of a phrase or troublesome initial set of data)

In one implementation, features appear in accordance with the amount of influence they have on classification. Features that have the most influence appear at the top of the list, while features with the least influenced appear at the end of the list. In another implementation, the first predetermined number of features may be automatically enabled. However, some of the disabled features, as illustrated in FIG. 9b, may be relevant and these can be enabled by the user manually. The user may also filter the view only by enabled features as illustrated in FIG. 9a, or by disabled features as illustrated in FIG. 9b. The user may also search for a feature 930, add a feature 932, refresh the listing 934 after changing the enable/disable status for a feature or continue with tuning based on 'feedback' 936.

Figure 10:
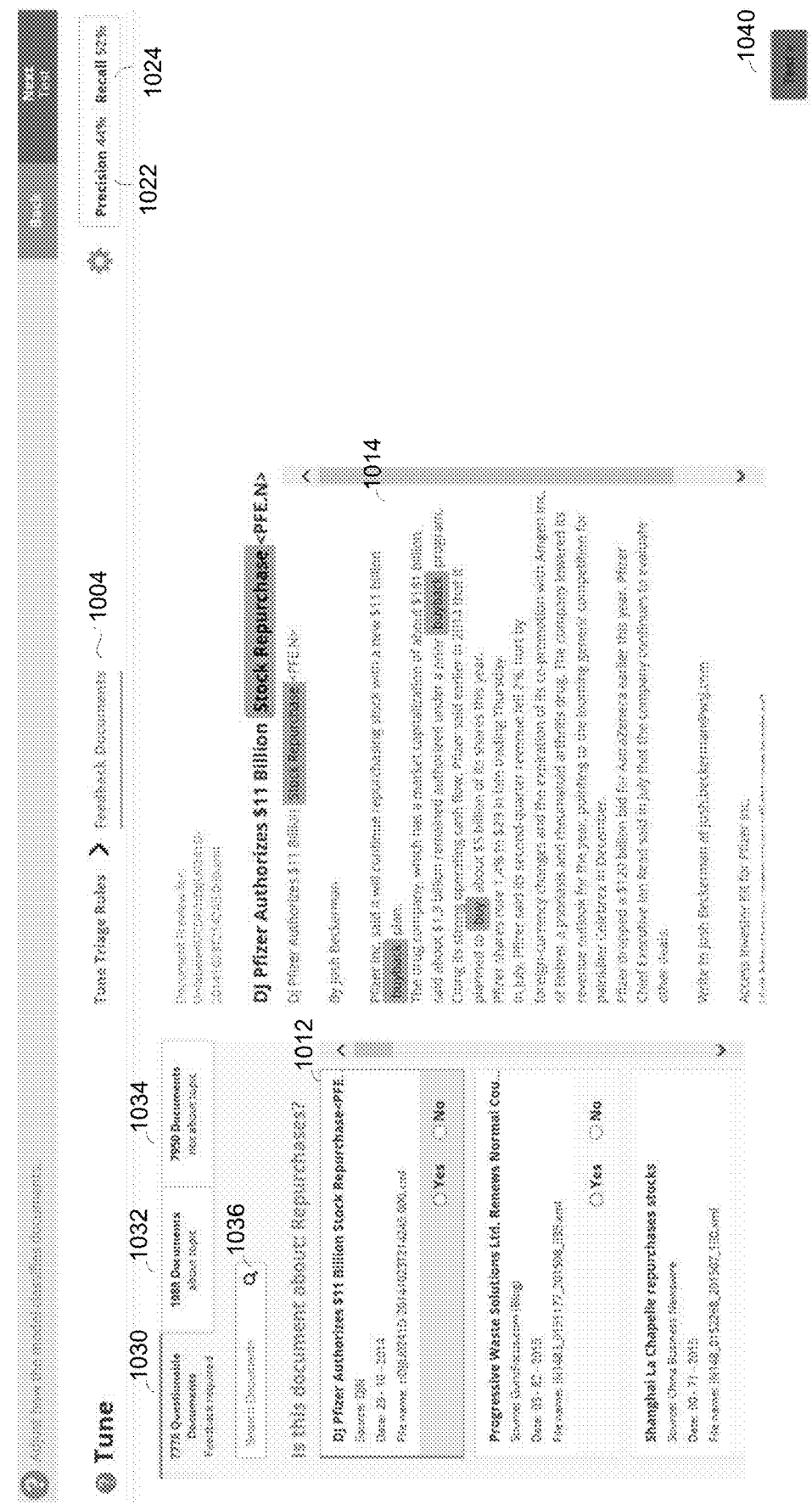

Turning to FIG. 10, an exemplary application interface 1000 is illustrated for tuning feedback documents 1004. In one implementation, the application interface 1000 may present the user with a tab listing questionable document 1030, documents relating to the topic 1032 and documents not about the topic 1034. The user may also search the documents using search field 1036. An exemplary prompt 1012 for user feedback on questionable document is presented along with a preview of the document 1014 with fields in question highlighted for the user's evaluation. In one implementation, the models are retrained when user feedback is received, as described in step 218. Tuning and retraining effects both the preliminary and customized classification model.

In a further implementation, a precision 122 and recall value 1024, which is recalculated in real time depending on user input, may also be simultaneously displayed in application interface 1000. Once the user is satisfied with the tuning of the model, the user may proceed by selecting the test option 1040 to select a test dataset and will eventually be presented with the test results as illustrated in FIG. 11a.

As shown in FIG. 11a, an exemplary application interface 1100 is presented to the user through user interface 174. In one implementation, application interface 1100 may illustrate the topics in the test 1102, along with its topic name, corresponding number of document count and corresponding precision and recall value. In a further implementation, the precision and recall values for the model may be presented in graphical form 1112 which may be but not limited to historical values in graphical form.

In yet a further implementation, the recall 1122 and precision value 1124 may be displayed in a separate section with options to edit 1126 the values. Precision and recall values are provided for the specific topic and for all topics in the test set.

Figure 11B:
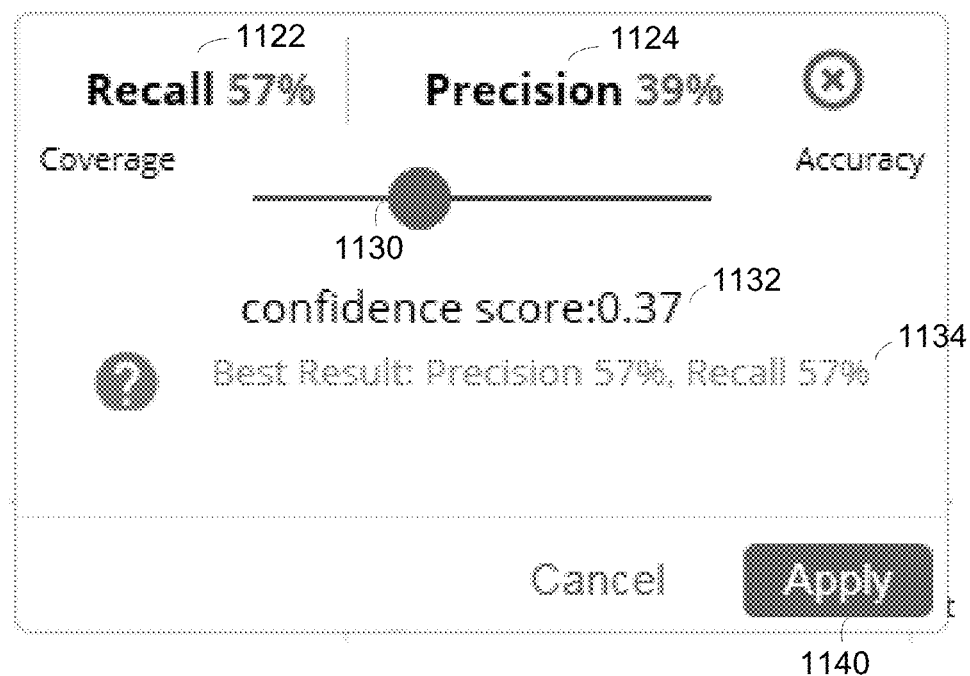

FIG. 11b is an example of the section that is displayed upon the user's selection of 'edit' 1126, which provides the user with an adjustable slider 1130 to change to a desired precision and recall value. Although slider 1130 is show in FIG. 11b, other forms of graphical input may be utilized by the user to change the values. A confidence score 1132 ranging from 0 to 1 indicating the probability that the topic is indeed discussed in the document (i.e, higher the value, the higher the probability) may be presented to the user and a proposal 1134 indicating suggested precision and recall numbers for best result may also be provided. Generally, moving the slider towards the direction of 'Precision' achieves higher accuracy results by ignoring certain topics with scores below a predetermined level, while moving the slider towards the direction of 'Recall' will achieve higher coverage by accepting more topics with lower scores. Changing the precision and recall threshold does not affect how the system identifies and assigns a topic, but rather it defines a filter to determine which topics are included in the output. The user may then select apply 1140 to continue with the revised values, which will trigger steps 216, 218, 206, 208, 210, 212, 214, 220, 222 as described in FIG. 2.

Returning to FIG. 11a, if the user is satisfied by the metrics presented (i.e., precision and recall value), they may select publish 1150 to publish the customized classification model to a production server. The published customized classification model may then become part of the production dataset 182.

FIGS. 1 through 11b are conceptual illustrations allowing for an explanation of the present disclosure. Various features of the system may be implemented in hardware, software, or a combination of hardware and software. For example, some features of the system may be implemented in one or more computer programs executing on programmable computer. Each program may be implemented in a high level procedural or object-oriented programming language to communicate with a computer system or other machine. Furthermore, each such computer program may be stored on a storage medium such as read-only-memory (ROM) readable by a general or special purpose programmable computer or processor, for configuring and operating the computer to perform the functions described above.

Notably, the figures and examples above are not meant to limit the scope of the present disclosure to a single implementation, as other implementations are possible by way of interchange of some or all of the described or illustrated elements. Moreover, where certain elements of the present disclosure can be partially or fully implemented using known components, only those portions of such known components that are necessary for an understanding of the present disclosure are described, and detailed descriptions of other portions of such known components are omitted so as not to obscure the disclosure. In the present specification, an implementation showing a singular component should not necessarily be limited to other implementations including a plurality of the same component, and vice-versa, unless explicitly stated otherwise herein. Moreover, applicants do not intend for any term in the specification or claims to be ascribed an uncommon or special meaning unless explicitly set forth as such.

What is claimed is:

1. A computer-implemented method comprising:
receiving a set of documents comprising a set of positive labeled documents and a set of unlabeled documents, wherein the set of positive labeled documents comprises positive labeled documents that discuss a topic and the set of unlabeled documents comprises documents that are not designated as positive or negative for discussing the topic;
processing the set of documents to remove duplicate documents and noise within the documents;
generating a preliminary model for each topic of a set of topics of the set of documents;
training the preliminary model to determine an additional set of positive and negative documents based on an updated set of documents, wherein training comprises:
identifying a set of rules that a positive labelled document in the set of documents follow;
using the identified set of rules to determine at least one negative document from the set of documents to generate an updated set of documents, said updated set of documents comprises the set of positive documents and a reduced set of unlabeled documents with the at least one negative document removed; and
generating a customized classification model using the trained preliminary model and the additional set of positive and negative documents.

2. The method of claim 1 wherein training the preliminary model further comprises applying a nearest neighbor linking algorithm.

3. The method of claim 1 further comprising:
testing the customized classification model on a predetermined test set of documents and presenting to the user the precision and recall values associated with the testing.

4. The method of claim 1 further comprising:
providing the customized classification model along with at least a precision and recall value.

5. The method of claim 1 further comprising:
tuning the preliminary model and the customized classification model using one of triage rules, features selections, user feedback or combinations thereof;
generating a tuned preliminary model and a tuned customized classification model; and
providing the tuned customized classification model along with at least an updated precision or recall value.

6. The method of claim 5 wherein tuning using triage rules comprises:
providing a list of phrases to a user interface; and
applying a selected list of phrases to the set of documents in response to a selection of inclusion or exclusion, wherein a document containing one or more phrases from the list of phrases are indicative of the selected topic.

7. The method of claim 5 wherein tuning using features selection comprises providing a features list to a user interface, the features list further comprising a list of phrases which characterize documents associated with topic, applying a selected list of features to the set of documents in response to a selection of inclusion or exclusion.

8. The method of claim 5 wherein tuning using user feedback comprises providing a selectable dialog box on a user interface to indicate confirmation of a document relating to a topic.

9. The method of claim 7 further comprising weighting the features list based on a ranking.

10. The method of claim 5 further comprising publishing the tuned customized classification model.

11. The method of claim 1 further comprising:
validating the set of topics using the set of positive labeled documents and the set of negative documents.

12. The method of claim 11 further comprising determining by a user interface that a topic has sufficient documents for validating.

13. A system comprising:
a classification server including a processor and memory storing instructions that, in response to receiving a set of documents comprising a set of positive labeled documents and a set of unlabeled documents, wherein the set of positive labeled documents comprises documents that discuss a topic and the set of unlabeled documents comprises documents that are not designated as positive or negative for discussing the topic, cause the processor to:
process the set of documents to remove duplicate documents and noise within the documents;
generate a preliminary model for each topic of a set of topics of the set of documents;
train the preliminary model to determine an additional set of positive and negative documents based on an updated set of documents,
identifies a set of rules that positive labelled document in the set of documents follow;
uses the identified set of rules to determine negative documents from the set of documents to generate an updated set of documents, said updated set of documents comprises the set of positive documents and a reduced set of unlabeled documents with identified negative documents removed;
generate a customized classification model using the preliminary model and the additional set of positive and negative documents.

14. The system of claim 13, wherein the preliminary model applies a nearest neighbor linking algorithm.

15. The system of claim 13, wherein the memory storing instructions that, in response to receiving the set of documents comprising the set of positive labeled documents and the set of unlabeled documents, cause the processor to:
test the customized classification model on a predetermined test set of documents and presenting to the user the precision and recall values associated with the testing.

16. The system of claim 13, wherein the memory storing instructions that, in response to receiving the set of documents comprising the set of positive labeled documents and the set of unlabeled documents, cause the processor to:
provide the customized classification model along with at least a precision or recall value.

17. The system of claim 13, wherein the memory storing instructions that, in response to receiving the set of documents comprising the set of positive labeled documents and the set of unlabeled documents, cause the processor to:
tune the preliminary model and the customized classification model using one of triage rules, features selections, user feedback or combinations thereof;
generate a tuned preliminary model and a tuned customized classification model; and
provide the tuned customized classification model along with at least the precision and recall value.

18. The system of claim 17, wherein triage rules provides a list of phrases to a user interface and applies a selected list of phrases to the set of documents in response to a selection of inclusion or exclusion, wherein a document containing one or more phrases from the list of phrases are indicative of the selected topic.

19. The system of claim 17, wherein features selections provides a features list to a user interface, the features list further comprises a list of phrases which characterize documents associated with topic, and applies a selected list of features to the set of documents in response to a selection of inclusion or exclusion.

20. The system of claim 17 wherein user feedback provides a selectable dialog box on a user interface to indicate confirmation of a document relating to a topic.

21. The system of claim 19 wherein the features list is weighted based on a ranking.

22. The system of claim 17 wherein the memory storing instructions that, in response to receiving the set of documents comprising the set of positive labeled documents and the set of unlabeled documents, cause the processor to:
   publish the tuned customized classification model.

23. The system of claim 13 wherein the memory storing instructions that, in response to receiving the set of documents comprising the set of positive labeled documents and the set of unlabeled documents, cause the processor to:
   validate the set of topics using the set of positive labeled documents and the set of negative documents.

24. The system of claim 23 wherein the memory storing instructions that, in response to receiving the set of documents comprising the set of positive labeled documents and the set of unlabeled documents, cause the processor to:
   determine by a user interface that a topic has sufficient documents for validating.

\* \* \* \* \*